United States Patent
Han et al.

(10) Patent No.: US 8,963,197 B2
(45) Date of Patent: Feb. 24, 2015

(54) LIGHT EMITTING DIODE PACKAGE

(71) Applicant: LG Display Co., Ltd., Seoul (KR)

(72) Inventors: Myung Soo Han, Yangju-si (KR); Seung Ho Jang, Goyang-si (KR); Won Seok Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/107,193

(22) Filed: Dec. 16, 2013

(65) Prior Publication Data

US 2015/0001562 A1 Jan. 1, 2015

(30) Foreign Application Priority Data

Jun. 28, 2013 (KR) .................. 10-2013-0075145

(51) Int. Cl.
- *H01L 29/88* (2006.01)
- *H01L 29/861* (2006.01)
- *H01L 33/60* (2010.01)

(52) U.S. Cl.
CPC ...................................... *H01L 33/60* (2013.01)
USPC ...... 257/104; 257/79; 257/294; 257/E21.053; 257/E21.189; 257/E21.347; 257/E21.352; 257/E21.499; 257/E21.511

(58) Field of Classification Search
USPC .................. 257/79, 104, 291, 292, 293, 294, 257/E21.053, E21.189, E21.347, E21.352, 257/E21.499, E21.511, E21.252
See application file for complete search history.

(56) References Cited

U.S. PATENT DOCUMENTS

| | | | |
|---|---|---|---|
| 5,902,993 A * | 5/1999 | Okushiba et al. | 250/208.1 |
| 7,841,741 B2 * | 11/2010 | Chan et al. | 362/249.04 |
| 2013/0193464 A1 * | 8/2013 | Bae et al. | 257/94 |

* cited by examiner

*Primary Examiner* — David Nhu
(74) *Attorney, Agent, or Firm* — Fenwick & West LLP

(57) ABSTRACT

An LED package includes a package body having a well formed in its upper surface, where the well is configured to receive a light emitting chip. An optical lens is disposed above the package body and includes a hollow dome structure located above and encompassing the lateral extent of the light emitting chip within the well of the package body. In one implementation, the package body and the optical lens collectively include at least one protrusion and concave, where the protrusion is aligned with the concave so that the optical lens mates with the package body, thereby causing the optical lens to self align with the package body. In another implementation, a protruding inner portion of the upper surface of the package body mates with the hollow dome structure, achieving a similar purpose. Consequently, generation of an eccentric fault between the optical lens and the package body is prevented.

19 Claims, 4 Drawing Sheets

LIGHT EMITTING DIODE PACKAGE

The present application claims priority under 35 U.S.C. §119(a) of Korean Patent Application No. 10-2013-0075145 filed on Jun. 28, 2013, which is hereby incorporated by reference in its entirety.

BACKGROUND

1. Field of the Disclosure

The present application relates to a light emitting diode package.

2. Description of the Related Art

An ordinary cathode ray tube (CRT) is one among a wide number of display devices and is mainly employed in the monitors of television receivers, measuring instruments, and information terminals. It is difficult to apply the CRT to small and light electronic products, because of its weight and size. In other words, the CRT has a limit due to its weight and size while the trend for electronic products is to be light-weight and small in size.

To address this matter, a liquid crystal display (LCD) device using an electro-optical effect, a plasma display panel (PDP) using a gas discharge, and an electro-luminescent display (ELD) device using an electro-luminescent effect are expected to substitute for the CRT. Among these devices, the LCD device has actively been developed.

The LCD devices are gradually used in a wide range of application fields due to their advantages such as lightness, thinness, and low power consumption driving. Moreover, in order to meet demands of users, the LCD device is being manufactured to have a larger screen, to be thinner, and to consume lower power.

Such LCD devices display an image by controlling the amount of light transmitting liquid crystal. In other words, the LCD devices are not self-illuminating display devices, unlike CRTs. As such, an LCD device includes a backlight unit provided on the rear surface of an LCD panel. The backlight unit includes a separated light source providing light necessary to display an image.

The backlight unit employs a plasma type light source such as a cold cathode fluorescent lamp (CCFL), a hot cathode fluorescent lamp (HCFL), an external electrode fluorescent lamp (EEFL), an external and internal electrode fluorescent lamp (EIFL), or others. Alternatively, the backlight unit uses a white light emitting diode (LED) as a light source. Particularly, the white LED configured to emit white light is widely used in the backlight unit and a variety of lighting devices because of its features of long lifespan, low power consumption, small size, durability, and others.

In general, a direct type backlight unit included in a large-sized LCD device uses a plurality of LED packages, which are arranged on a printed circuit board (PCB), as a light source. Each of the LED packages includes a light emitting chip.

In order to enhance light efficiency of the LED package, an optical lens is mounted above the LED package. Methods of mounting optical lens include a molding mode and a fixing mode. The molding mode directly attaches the optical lens on the LED package. The fixing mode overlap-disposes the optical lens above the LED package and fastens the optical lens to the PCB which loads with the LED package.

Particularly, the large-sized LCD device or lighting device allows the optical lens to be aligned above the LED package and then fastened to the PCB, according to the fixing mode. As such, the optical lens and the LED package must be accurately aligned with each other.

If it is generated misalignment of the LED package and the optical lens, light emitted from the light emitting chip is distorted during passing through the optical lens. Due to this, light efficiency can deteriorate and high brightness of a vertical direction (a light spot) can be generated.

Also, using the fixing mode to fasten the optical lens to the PCB makes aligning the optical lens with the LED package more difficult as compared to using the molding mode instead, which directly attaches the optical lens on the LED package.

In practice, the alignment of the optical lens and the LED package is performed by a worker. More specifically, the worker first loads the LED package on the PCB while a position coordinate of the LED package is displayed on a screen and second positions the optical lens above the LED package, before fastening the optical lens to the PCB. Thereafter, the worker compares the position coordinates of the LED package and the optical lens and inspects whether the optical lens and the LED package are misaligned or not.

The comparison of the position coordinate of the optical lens with that of the LED package complexes the aligning procedure of the optical lens and the LED package. Moreover, since the inspection of misalignment is performed after the loading of the optical lens, it is difficult to directly and rapidly correct the misalignment of the LED package and the optical lens.

If the position coordinate of the LED package and the position coordinate of the optical lens are misaligned, the positioned optical lens must be separated from and then re-positioned above the LED package. Moreover, the position coordinates of the LED package and the optical lens must be compared for the inspection of misalignment.

SUMMARY

Accordingly, embodiments of the present application are directed to an LED package that substantially obviates one or more of problems due to the limitations and disadvantages of the related art.

The embodiments provide an LED package that is adapted to prevent the generation of an eccentric fault between an optical lens and a package body by forming one or more aligning concaves and protrusions in the optical lens and the package body collectively, thereby facilitating the optical lens and the package body to self-align with each other.

Also, the embodiments provide an LED package that is adapted to prevent the generation of an eccentric fault between an optical lens and a package body by forming a lower-leveled outer portion of an upper surface on the package body adjacent to an aligning protrusive inner portion of an upper surface of the package body. The protrusive inner portion is configured to fit within a hollow domed structure of the optical lens, thereby facilitating the optical lens and the package body to self-align with each other.

According to one embodiment, the LED package includes: a package body including a well formed in an upper surface of the package body, the well configured to receive a light emitting chip; an optical lens disposed above the package body and including a hollow dome structure disposed above the light emitting chip and at least a part of the package body; a plurality of concaves formed in the upper surface of the package body; and a plurality of protrusions formed in a rear surface of the optical lens opposite to the plurality of concaves, the protrusions shaped to fit within the concaves such that the rear surface of the optical lens mates with the upper surface of the package body, thereby causing the optical lens to self align with the package body.

According to another embodiment, the LED package includes: a package body comprising a well formed in an upper surface of the package body, the well configured to receive a light emitting chip; an optical lens disposed above the package body and comprising a hollow dome structure disposed above the light emitting chip and at least a part of the package body; a plurality of protrusions formed in the upper surface of the package body; and a plurality of concaves formed in a rear surface of the optical lens opposite to the plurality of second aligning protrusions, the protrusions shaped to fit within the concaves such that the rear surface of the optical lens mates with the upper surface of the package body, thereby causing the optical lens to self align with the package body.

According to yet another embodiment, the LED package includes: a package body including an upper surface having an outer portion encompassing an inner portion, the inner portion protruding in height relative to the outer portion, the package body further including a well formed in the inner portion, the well configured to receive a light emitting chip; an optical lens disposed above the package body and including a hollow dome structure above the light emitting chip and at least a part of the package body, a bottom edge of the hollow dome structure adjoining a rear surface of the optical lens, the bottom edge of the hollow dome structure formed to fit around the inner portion of the upper surface of the package body, such that the rear surface of the optical lens mates with the outer portion of the upper surface of the package body, thereby causing the optical lens to self align with the package body.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION OF THE EMBODIMENTS

Figure 1:
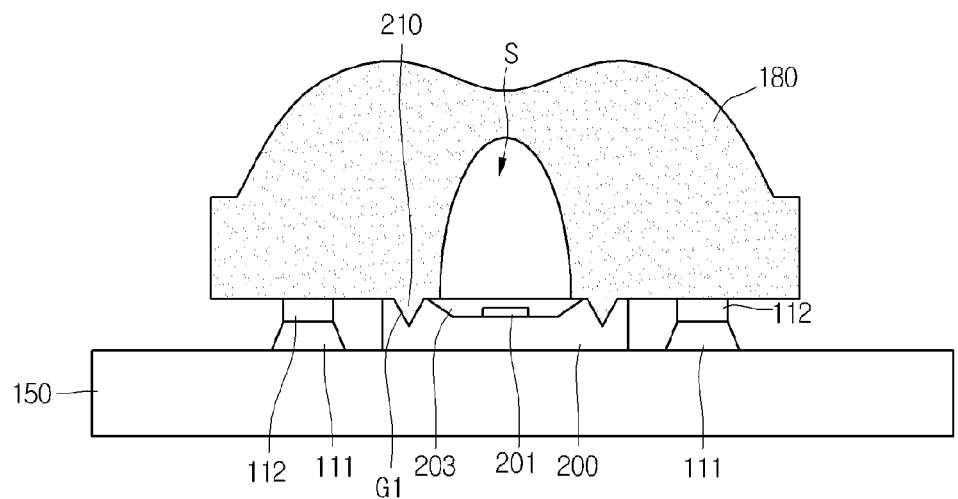
FIG. 1 is a cross-sectional view showing the structure of an LED package according to a first embodiment of the present disclosure.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

FIG. 1 is a cross-sectional view showing the structure of an LED package according to a first embodiment of the present disclosure.

Referring to FIG. 1, the LED package according to a first embodiment of the present disclosure includes; a package body 200 including a well shaped recession; a light emitting chip 201 received inside the package body 200; a mold layer 203 filled in a well of the package body 200; and an optical lens 180 disposed above the light emitting chip 201. The light emitting chip 201 is covered with the mold layer 203. The optical lens 180 is fastened to a printed circuit board (PCB) 150.

The optical lens 180 can be fastened to the PCB 150 by attaching bumps 112, which are arranged on a rear surface of the optical lens 180, to adhesion members 111 which are formed on the PCB 150. The adhesion members 111 can be formed from an adhesive material such an epoxy paste. Signal lines (not shown) are formed on the PCB 150. The signal lines are used to apply driving signals to a lead frame (not shown) which is formed on the package body 200.

The light emitting chip 201 is loaded inside the well of the package body 200 through a flip chip bonding process as shown in the drawing, but it is not limited to this. In other words, the light emitting chip 201 can be placed inside the package body 200 using a wire bonding method. The mold layer 203 filling the well of the package body 200 can include a fluorescent material. The light emitting chip 201 can include one of red R, green G and blue B LEDs.

The optical lens 180 includes a hollow dome structure, where inside the hollow dome structure is an empty space S. The hollow dome structure causes the optical lens to be thinner in a region that overlaps with the light emitting chip 201. More specifically, the optical lens 180 is positioned with respect to the package body such that the hollow dome structure overlaps with the well and light emitting chip 201 of the package body. The hollow dome structure is wide enough in lateral extent so as to encompass the lateral extent of the light emitting chip 201. The bottom of the hollow dome structure adjoins the bottom surface of the optical lens 180, that is, the bottom of the hollow dome structure is part of the optical lens 180 and is directly adjacent to the bottom surface of the of the optical lens 180. Such an optical lens 180 can reduce brightness of a perpendicular direction to the light emitting chip 201 and diffuse light in the circumference of the light emitting chip 201, i.e. in lateral directions.

In order to prevent an eccentric fault between the optical lens 180 and the package body 200 with the light emitting chip 201, the first embodiment includes at least one first aligning protrusion 210 to be formed in at least one region of the rear surface of the optical lens 180 adjacent to the bumps 112. The first aligning protrusion 210 can be formed as a single body united with the optical lens 180. Alternatively, the first aligning protrusion may be formed as a separate structure attached to the optical lens 180. Also, at least one first aligning concave G1 is formed in an upper surface of the package body 200 (more specifically, formed into an upper surface of the package body 200) opposite to the first aligning protrusion 210.

The first aligning protrusion 210 formed in the optical lens 180 is formed to directly engage with the first aligning concave G1 formed in the package body 200 when the hollow dome structure is disposed above the light emitting chip 201 after the package body 200 has already been loaded with the light emitting chip 201. When the protrusion 210 and concave G1 are engaged, at least a portion of the bottom surface of the optical lens mates with (e.g., is flush with) at least a portion of the upper surface of the package body.

In accordance therewith, the mechanical combination of the first aligning protrusion 210 and the first aligning concave G1 can prevent the generation of an eccentric fault when the optical lens 180 is fastened to the PCB 150.

Figure 2A:
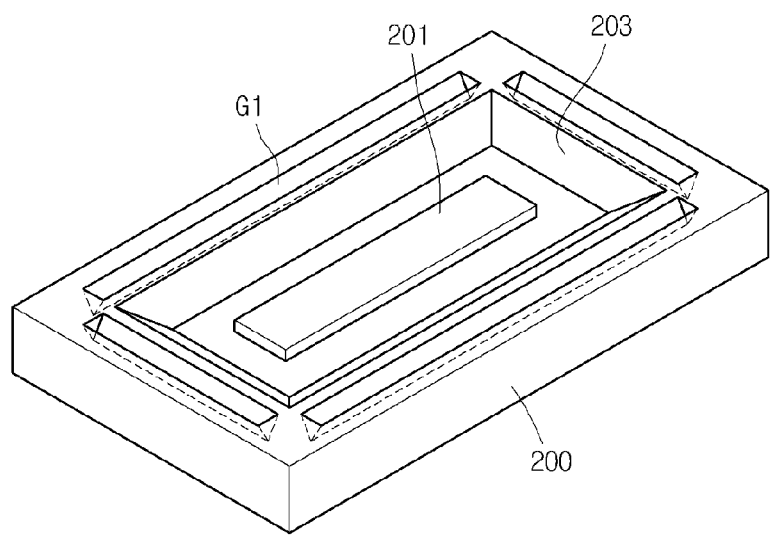
FIGS. 2A through 2C are perspective views showing a variety of examples for align grooves which are formed in a body portion of the LED package in FIG. 1.
Figure 2B:
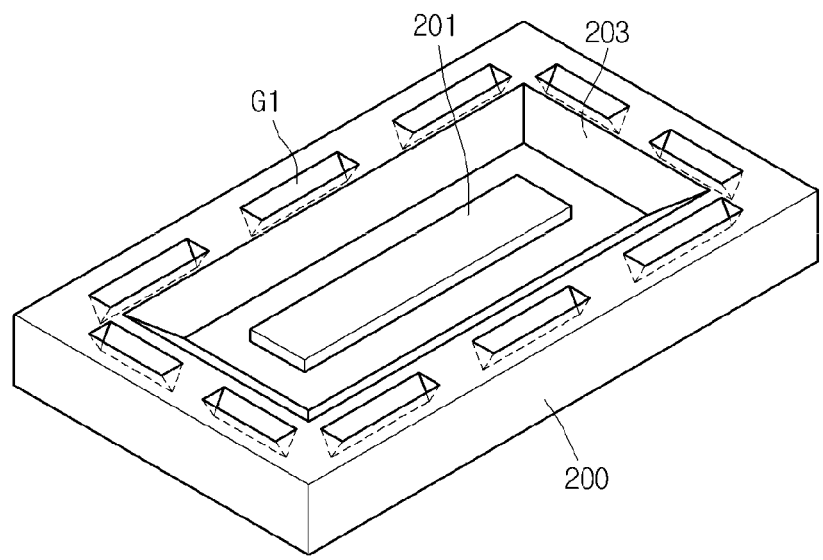
Figure 2C:
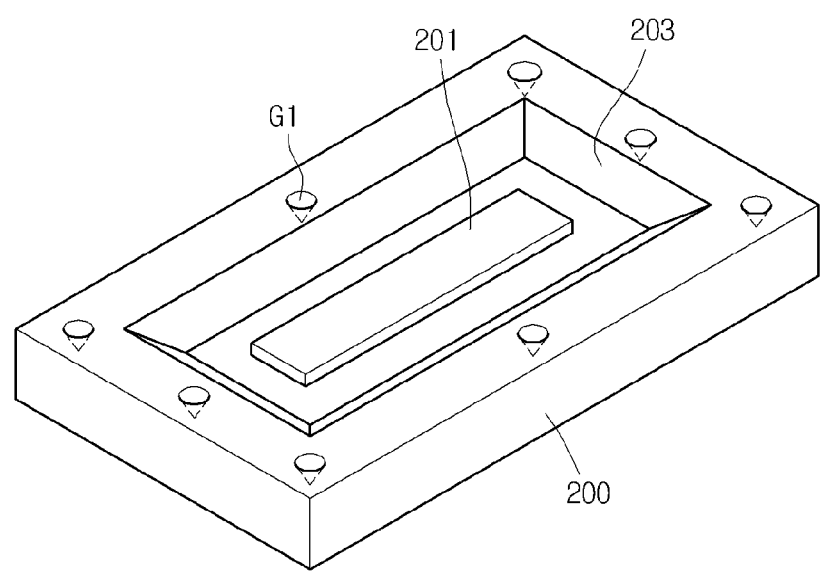

FIGS. 2A through 2C are perspective views showing a variety of examples for aligning concaves which are formed in a body portion of the LED package in FIG. 1.

Referring to FIGS. 1 through 2C, the LED package allows the first aligning concaves G1 opposite to the first aligning protrusions 210 of the optical lens 180 to be formed in the upper surface of the package body 200.

The first aligning concaves G1 can be formed in the upper surface of the package body 200 along the circumference of the well receiving the light emitting chip 201. Also, the first aligning concaves G1 can be formed in a straight-line groove shape which progresses along each of four edges of the upper surface of the package body 200 (e.g., proceeding along in parallel with each side wall of the package body 200), as shown in FIG. 2A. Moreover, more than one first aligning concave G1 can be formed in each edge of the upper surface of the package body 200, as shown in FIG. 2B.

Alternatively, rather than forming the concaves along lines parallel to the edges of the package body, the first aligning concaves G1 may instead be formed at discrete locations in the upper surface, for example in discrete funnel shapes as shown in FIG. 2C. The funnel-shaped first aligning concaves G1 can be formed in four corners and four edges of the upper surface of the package body 200. Also, the funnel-shaped first aligning concaves G1 can be formed at least one in each edge of the upper surface of the package body 200. In other words, the funnel-shaped first aligning concaves G1 can be formed in four side walls of the package body 200 and four corners to which the four side walls meet.

The first aligning protrusions 210 of the optical lens 180 corresponding to and opposite to the first aligning concaves G1 are formed to fit within the concaves. Thus, in case of a straight-line groove shape, the protrusions may similarly be straight line triangle shaped protrusions 210. In case of discrete location concaves G1 such as the funnels of FIG. 2C, the protrusions 210 may be of a cone shape.

However, the shapes of the first aligning concaves G1 shown in FIGS. 2A through 2C are merely example shapes. As such, the first aligning concaves G1 can be formed in a variety of shapes. For example, the first aligning concaves G1 can be formed in any of circular, quadrilateral, triangular and elliptical shapes. More generally, the first aligning concaves G1 may be formed in any inverse tapering shape. The shapes of the first aligning protrusions 210 matches the shape of the first aligning concaves G1 so that the protrusions fit within the concaves. Thus, generally the protrusions have a tapering shape. In another embodiment, the first aligning concaves G1 are grooves that are not necessarily inverse tapered, and the protrusions have a tooth shape that is also not necessarily tapered.

As such, the first embodiment facilitates the optical lens and the package body self-aligning with each other. Therefore, the generation of an eccentric fault between the optical lens and the package body or the light emitting chip can be prevented.

Figure 3:
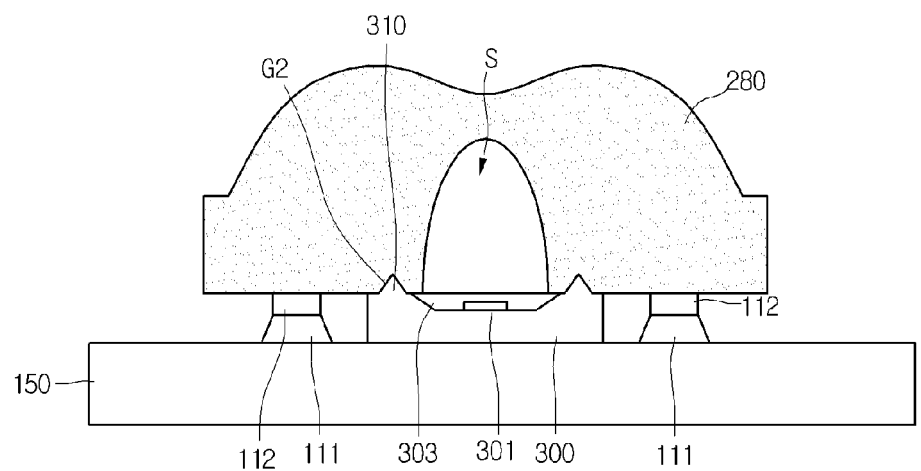
FIG. 3 is a cross-sectional view showing the structure of an LED package according to a second embodiment of the present disclosure.

FIG. 3 is a cross-sectional view showing the structure of an LED package according to a second embodiment of the present disclosure.

Referring to FIG. 3, the LED package according to a second embodiment of the present disclosure includes: a package body 300 including a well shaped recession; a light emitting chip 301 received inside the well of the package body 300; a mold layer 303 filling in the well of the package body 300; and an optical lens 280 disposed above the light emitting chip 301. The light emitting chip 301 is covered with the mold layer 303. The optical lens 280 is fastened to a printed circuit board (PCB) 150.

The LED package of the second embodiment includes second aligning protrusions 310 formed in the package body 300, the protrusions 310 formed at complementary positions with concaves G2 formed in the optical lens 280. Thus, the LED package of the second embodiment reverses the locations of the protrusions and concaves relative to the first embodiment. Other than this distinction, all description above with regard to the first embodiment and FIGS. 1 and 2A-2C is equally applicable to the second embodiment.

Figure 4:
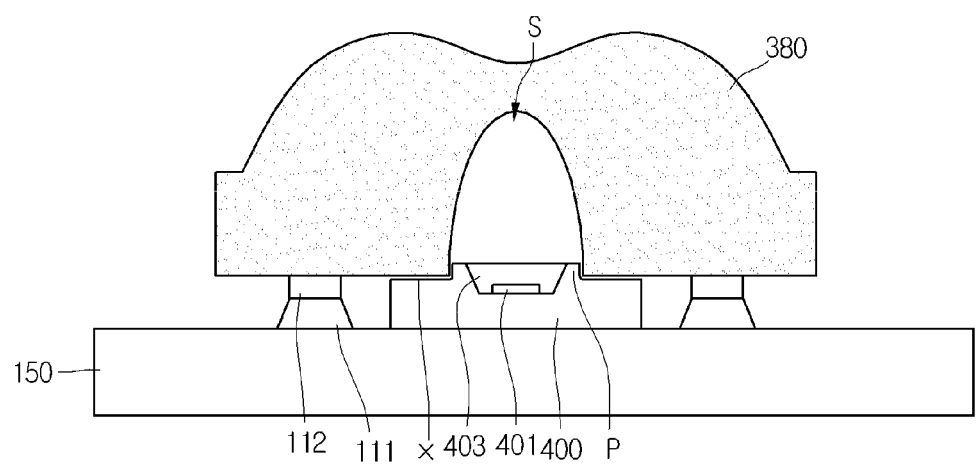
FIG. 4 is a cross-sectional view showing the structure of an LED package according to a third embodiment of the present disclosure.

FIG. 4 is a cross-sectional view showing the structure of an LED package according to a third embodiment of the present disclosure.

Referring to FIG. 4, the LED package according to a third embodiment of the present disclosure includes: a package body 400 including a well shaped recession; a light emitting chip 401 received inside the well of the package body 400; a mold layer 403 filling in the well of the package body 400; and an optical lens 380 disposed above the light emitting chip 401. The light emitting chip 401 is covered with the mold layer 403. The optical lens 380 is fastened to a printed circuit board (PCB) 150.

The LED package of the third embodiment allows the optical lens 380 and the package body 400 to be self-aligned with each other without making any structural modification to the optical lens 380. In the third embodiment, the upper surface of the package body 400 has an outer portion X and an inner portion P. The inner portion P protrudes towards the optical lens 380 with respect to the outer portion X, thus the outer portion X is at a lower level relative to the inner portion P. The inner portion P has a lateral extent configured to fit within and be encompassed by the hollow dome structure of the optical lens 380. The bottom edge of the hollow dome structure adjoins the bottom surface of the optical lens 380. The inner protruding portion P of the package body 400 facilitates self alignment between the package body 400 and the optical lens 380. When placed into contact, the bottom surface of the optical lens mates (e.g., is flush with) the outer portion X of the upper surface of the package body 400.

In this way, the LED package of the third embodiment enables the bottom edge of the hollow dome structure next to the rear surface of the optical lens 380 to be guided by the aligning protrusive portion and placed on the outer, lower-leveled portion of the upper surface of the package body 400. As such, the optical lens and the package body can be directly self-aligned with the each other. Therefore, the generation of an eccentric fault between the optical lens and the package body including the light emitting chip can be prevented.

Figure 5:
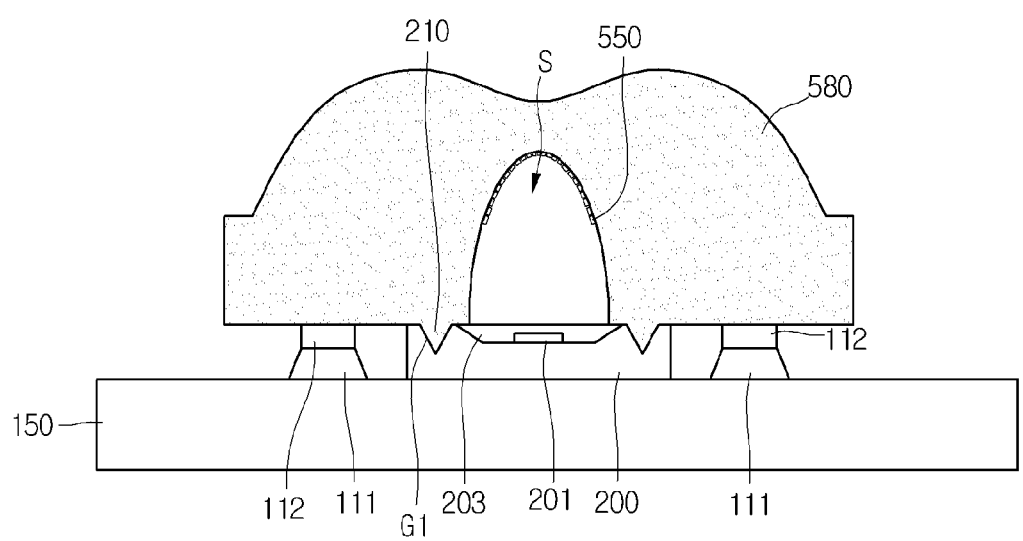
FIG. 5 is a cross-sectional view showing the structure of an LED package according to a fourth embodiment of the present disclosure.

FIG. 5 is a cross-sectional view showing the structure of an LED package according to a fourth embodiment of the present disclosure.

The LED package of the fourth embodiment shown in FIG. 5 has a structure capable of enhancing the light diffusion property of that of the first embodiment. Diffusive patterns disclosed by the fourth embodiment can similarly be applied to the LED packages of the first, second and third embodiments in the same manner.

The optical lens 580 disclosed in the present disclosure becomes thinner in a region, which overlaps with the light emitting chip 201, compared to the other regions in order to reduce brightness in a perpendicular directions to the light emitting chip 201. In other words, the optical lens 580 is formed to have a hollow dome structure. As such, when the light emitting chip 201 is encompassed with the optical lens 580, an empty space S is formed above the light emitting chip 201 by means of the optical lens 580.

The LED package according to a fourth embodiment of the present disclosure includes a plurality of diffusive patterns 550 formed on an inner surface of the optical lens 580 which forms the empty space S. The diffusive patterns 550 can be formed in such a manner that their density become lower as it goes from a vertex (or a central point) of the inner surface of the optical lens 580 toward the light emitting chip 201 (or the rear surface of the optical lens 580).

In the same or a different embodiment, the size of the diffusive patterns 550 formed on the inner surface of the optical lens can become smaller as it goes from a vertex (or a central point) of the inner surface of the optical lens 580 toward the light emitting chip 201 (or the rear surface of the optical lens 180).

As such, the LED package according to a fourth embodiment of the present disclosure can prevent a remarkable high brightness, such as a light spot fault, in the overlapping region with (or the perpendicular directions to) the light emitting chip 201. Also, the LED package of the fourth embodiment can efficiently diffuse brightness in the circumference (or the lateral directions) of the light emitting chip 210. Therefore, the LED package of the fourth embodiment can provide a uniform brightness property.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting diode package comprising:
   a package body including a well formed in an upper surface of the package body, the well configured to receive a light emitting chip;
   an optical lens disposed above the package body and including a hollow dome structure disposed above the light emitting chip and at least a part of the package body;
   a plurality of concaves formed in the upper surface of the package body; and
   a plurality of protrusions formed in a rear surface of the optical lens opposite to the plurality of concaves, the plurality of protrusions shaped to fit within the plurality of concaves such that the rear surface of the optical lens mates with the upper surface of the package body, thereby causing the optical lens to self align with the package body.

2. The light emitting diode package of claim 1, wherein the hollow dome structure adjoins the rear surface of the optical lens, the hollow dome structure overlapping with the light emitting chip.

3. The light emitting diode package of claim 1, further comprising a mold layer in the well between the light emitting chip and the optical lens.

4. The light emitting diode package of claim 1, wherein
   the package body is loaded on a printed circuit board provided with signal lines, and
   the optical lens is fastened on the printed circuit board.

5. The light emitting diode package of claim 1, further comprising a plurality of diffusive patterns formed on an inner surface of the hollow dome structure.

6. The light emitting diode package of claim 5, wherein the diffusive patterns becomes lower in density as it goes from a vertex of the inner surface of the hollow dome structure toward the light emitting chip.

7. The light emitting diode package of claim 5, wherein the diffusive patterns becomes smaller in size as it goes from a vertex of the inner surface of the hollow dome structure toward the light emitting chip.

8. The light emitting diode package of claim 1, wherein
   the plurality of concaves are formed in a tapered shape and
   the plurality of protrusions are formed in an inverse tapered shape relative to the plurality of concaves.

9. The light emitting diode package of claim 1, wherein
   the plurality of concaves are formed in a straight-line groove shape, and
   the plurality of protrusions are formed in a straight-line tooth shape.

10. A light emitting diode package comprising:
    a package body comprising a well formed in an upper surface of the package body, the well configured to receive a light emitting chip;
    an optical lens disposed above the package body and comprising a hollow dome structure disposed above the light emitting chip and at least a part of the package body;
    a plurality of protrusions formed in the upper surface of the package body; and
    a plurality of concaves formed in a rear surface of the optical lens opposite to the plurality of second aligning protrusions, the plurality of protrusions shaped to fit within the plurality of concaves such that the rear surface of the optical lens mates with the upper surface of the package body, thereby causing the optical lens to self align with the package body.

11. The light emitting diode package of claim 10, wherein the hollow dome structure adjoins the rear surface of the optical lens, the hollow dome structure overlapping with the light emitting chip.

12. The light emitting diode package of claim 10, further comprising a mold layer in the well between the light emitting chip and the optical lens.

13. The light emitting diode package of claim 10, wherein
    the package body is loaded on a printed circuit board provided with signal lines, and
    the optical lens is fastened on the printed circuit.

14. The light emitting diode package of claim 10, further comprising a plurality of diffusive patterns formed on an inner surface of the hollow dome structure.

15. The light emitting diode package of claim 14, wherein the diffusive patterns becomes lower in density as it goes from a vertex of the inner surface of the hollow dome structure toward the light emitting chip.

16. The light emitting diode package of claim 15, wherein the diffusive patterns becomes smaller in size as it goes from a vertex of the inner surface of the hollow dome structure toward the light emitting chip.

17. The light emitting diode package of claim 10, wherein the plurality of concaves are formed in a tapered shape, and the plurality of protrusions are formed in an inverse tapered shape relative to the plurality of concaves.

18. The light emitting diode package of claim 10, wherein
the plurality of concaves are formed in a straight-line groove shape, and
the plurality of protrusions are formed in a straight-line tooth shape.

19. A light emitting diode package comprising:

a package body including an upper surface having an outer portion encompassing an inner portion, the inner portion protruding in height relative to the outer portion, the package body further including a well formed in the inner portion, the well configured to receive a light emitting chip;

an optical lens disposed above the package body and including a hollow dome structure above the light emitting chip and at least a part of the package body, a bottom edge of the hollow dome structure adjoining a rear surface of the optical lens, the bottom edge of the hollow dome structure formed to fit around the inner portion of the upper surface of the package body, such that the rear surface of the optical lens mates with the outer portion of the upper surface of the package body, thereby causing the optical lens to self align with the package body.

* * * * *